United States Patent
Biswas et al.

(10) Patent No.: US 10,916,290 B2
(45) Date of Patent: Feb. 9, 2021

(54) MEMORY SYSTEM HAVING COMBINED HIGH DENSITY, LOW BANDWIDTH AND LOW DENSITY, HIGH BANDWIDTH MEMORIES

(71) Applicant: Apple Inc., Cupertino, CA (US)

(72) Inventors: Sukalpa Biswas, Fremont, CA (US); Farid Nemati, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/734,595

(22) Filed: Jan. 6, 2020

(65) Prior Publication Data

US 2020/0143866 A1 May 7, 2020

Related U.S. Application Data

(62) Division of application No. 16/098,916, filed as application No. PCT/US2017/020976 on Mar. 6, 2017, now Pat. No. 10,573,368.

(Continued)

(51) Int. Cl.
*G11C 11/402* (2006.01)
*H01L 23/00* (2006.01)
(Continued)

(52) U.S. Cl.
CPC .......... *G11C 11/4023* (2013.01); *G11C 5/025* (2013.01); *G11C 5/04* (2013.01);
(Continued)

(58) Field of Classification Search
CPC ....... G11C 11/4023; G11C 5/04; G11C 5/025; G11C 5/06; G11C 7/02; G11C 11/40607;
(Continued)

(56) References Cited

U.S. PATENT DOCUMENTS 5,877,780 A   3/1999  Lu et al.
6,453,400 B1 * 9/2002  Maesako .................. G11C 8/12
                                                        711/167

(Continued)

FOREIGN PATENT DOCUMENTS

CN        1620700 A     5/2005
CN      102640225 A     8/2012
(Continued)

OTHER PUBLICATIONS

IPRP, PCT Application No. PCT/US2017/020976, dated Nov. 2, 2018, 6 pages.

(Continued)

*Primary Examiner* — Jerome LeBoeuf
(74) *Attorney, Agent, or Firm* — Kowert, Hood, Munyon, Rankin & Goetzel, P.C.; Lawrence J. Merkel

(57) ABSTRACT

In an embodiment, a memory system may include at least two types of DRAM, which differ in at least one characteristic. For example, one DRAM type may be a high density DRAM, while another DRAM type may have lower density but may also have lower latency and higher bandwidth than the first DRAM type. DRAM of the first type may be on one or more first integrated circuits and DRAM of the second type may be on one or more second integrated circuits. In an embodiment, the first and second integrated circuits may be coupled together in a stack. The second integrated circuit may include a physical layer circuit to couple to other circuitry (e.g. an integrated circuit having a memory controller, such as a system on a chip (SOC)), and the physical layer circuit may be shared by the DRAM in the first integrated circuits.

20 Claims, 7 Drawing Sheets

Related U.S. Application Data

(60) Provisional application No. 62/355,012, filed on Jun. 27, 2016.

(51) Int. Cl.

| | | |
|---|---|---|
| *G11C 5/06* | (2006.01) | |
| *G11C 5/04* | (2006.01) | |
| *H01L 25/10* | (2006.01) | |
| *H01L 25/065* | (2006.01) | |
| *G11C 5/02* | (2006.01) | |
| *G11C 7/02* | (2006.01) | |
| *G11C 11/406* | (2006.01) | |
| *H01L 27/02* | (2006.01) | |

(52) U.S. Cl.
CPC ............ *G11C 5/06* (2013.01); *G11C 5/063* (2013.01); *G11C 7/02* (2013.01); *G11C 11/40607* (2013.01); *H01L 24/00* (2013.01); *H01L 25/0652* (2013.01); *H01L 25/105* (2013.01); *H01L 25/0657* (2013.01); *H01L 27/0203* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2924/15311* (2013.01)

(58) Field of Classification Search
CPC .............. G11C 5/063; G11C 2207/105; G11C 2207/108; G11C 7/10; G11C 11/4093; H01L 24/00; H01L 25/105; H01L 25/0652; H01L 2224/16225; H01L 2225/06513; H01L 2224/16145; H01L 2225/06517; H01L 2924/15311; H01L 2225/06541; H01L 25/0657; H01L 27/0203; H01L 2224/131
See application file for complete search history.

(56) References Cited

U.S. PATENT DOCUMENTS

| | | |
|---|---|---|
| 6,681,271 B2 | 1/2004 | Chih-Hung et al. |
| 8,097,956 B2 | 1/2012 | von Kaenel |
| 8,171,207 B2 | 5/2012 | Chang et al. |
| 8,219,746 B2 | 7/2012 | Tremaine |
| 8,595,429 B2 | 11/2013 | Gu et al. |
| 8,711,631 B1 | 4/2014 | Asnaashai |
| 8,957,691 B2 | 2/2015 | Wang et al. |
| 9,432,298 B1 | 8/2016 | Smith |
| 10,573,368 B2 | 2/2020 | Biswas et al. |
| 2003/0007405 A1 | 1/2003 | Kyung |
| 2003/0002692 A1 | 6/2003 | Gonzalez Carlos et al. |
| 2003/0112692 A1 | 6/2003 | Gonzalez et al. |
| 2003/0158995 A1 | 8/2003 | Lee et al. |
| 2009/0049245 A1* | 2/2009 | Resnick .............. G06F 12/0846 711/118 |
| 2009/0182977 A1 | 7/2009 | Rao |
| 2011/0161748 A1 | 6/2011 | Casper et al. |
| 2012/0021563 A1 | 1/2012 | Koyanagi et al. |
| 2012/0252164 A1 | 10/2012 | Nakao et al. |
| 2013/0031327 A1* | 1/2013 | Chang ................... G06F 12/084 711/170 |
| 2013/0138892 A1 | 5/2013 | Loh |
| 2014/0164713 A1 | 6/2014 | Sim |
| 2014/0181389 A1 | 6/2014 | Poremba |
| 2015/0006805 A1 | 1/2015 | Feekes et al. |
| 2015/0113356 A1 | 4/2015 | Ken et al. |
| 2019/0198083 A1 | 6/2019 | Biswas |

FOREIGN PATENT DOCUMENTS

| | | |
|---|---|---|
| CN | 104572496 A | 4/2015 |
| JP | 2003-282823 A | 10/2003 |
| JP | 2011-510408 T | 3/2011 |
| JP | 2015-079511 A | 4/2015 |
| JP | 2015-528599 T | 9/2015 |
| KR | 10-2010-010167 A | 9/2010 |
| KR | 10-2015-0044370 A | 4/2015 |

OTHER PUBLICATIONS

ISR, PCT/US2017/020976, dated Mar. 6, 2017, 11 pages.
Office Action, China National Intellectual Property Administration; Chinese Application for Invention No. 201780033666.9; dated Jun. 3, 2019, 19 Pages.
Supplementary European Search Report, European Patent application 17820683.5, dated Nov. 7, 2019, 9 pages.
Chang, M., et al. Technology Comparison for Large Last-Level Caches (L3Cs): Low-Leakage SRAM, Low Write-Energy STT-RAM, and Refresh-Optimized eDRAM, 2013 IEEE 19th International Symposium on High Performance Computer (Year: 2013).
JPO, Japanese Patent Application No. 2018-560772, Office Action, dated Dec. 23, 2019, 9 pages.
KIPO, Office Action, KR Patent Application No. 10-2018-7034289, dated Feb. 19, 2020, 14 pages.
KIPO, Korean Patent Application No. 10-2018-7034289, Notice of Last Preliminary Rejection(Non-Final) (Office Action), dated Sep. 23, 2020, 13 pages, including translation (original Korean document begins on p. 7)
JPO, Patent Application No. 2018-560772, Decision of Final Rejection, dated Nov. 5, 2020, 2 pages.
EP Application No. 17 820 683.5-1203, Communication Article, dated Nov. 10, 2020, 5 pages.
Examination Report, Intellectual Property India, Application No. 201817047961, 6 pages, dated Nov. 23, 2020.

\* cited by examiner

MEMORY SYSTEM HAVING COMBINED HIGH DENSITY, LOW BANDWIDTH AND LOW DENSITY, HIGH BANDWIDTH MEMORIES

This application is a division of U.S. patent application Ser. No. 16/098,916, filed on Nov. 5, 2018 and now U.S. Pat. No. 10,573,368, which is a 371 of PCT Application No. PCT/US2017/020976, filed Mar. 6, 2017, which claims benefit of priority to U.S. Provisional Patent Application Ser. No. 62/355,012, filed on Jun. 27, 2016. The above applications are incorporated herein by reference. To the extent that any material in the incorporated application conflicts with material expressly set forth herein, the material expressly set forth herein controls.

BACKGROUND

Technical Field

Embodiments described herein are related to electronic systems that include dynamic random access memory (DRAM).

Description of the Related Art

As DRAM has continued to evolve, the design of DRAM has been complicated by the disparate goals of an ideal DRAM: a dense storage that has high bandwidth, high capacity, and low power consumption (high energy efficiency). Design choices that improve density/capacity have a tendency to reduce (or at least not increase) bandwidth. Design choices that can increase bandwidth have a tendency to reduce (or at least not increase) capacity and energy efficiency.

SUMMARY

In an embodiment, a memory system may include at least two types of DRAM, which differ in at least one characteristic. For example, one DRAM type may be a high density DRAM, while another DRAM type may have lower density but may also have lower latency and higher bandwidth than the first DRAM type. DRAM of the first type may be on one or more first integrated circuits and DRAM of the second type may be on one or more second integrated circuits. Providing a memory system with two types of DRAM (e.g. one high density and one low latency, high bandwidth) may permit a highly energy-efficient operation, which may make the memory system suitable for portable devices and other devices where energy efficiency and performance per unit of energy expended are key attributes.

In an embodiment, the first and second integrated circuits may be coupled together in a stack. The second integrated circuit may include a physical layer circuit to couple to other circuitry (e.g. an integrated circuit having a memory controller, such as a system on a chip (SOC)), and the physical layer circuit may be shared by the DRAM in the first integrated circuits. In some embodiments, high energy efficiency, high capacity, and low latency may be realized using the memory.

BRIEF DESCRIPTION OF THE DRAWINGS

The following detailed description makes reference to the accompanying drawings, which are now briefly described.

Figure 1:
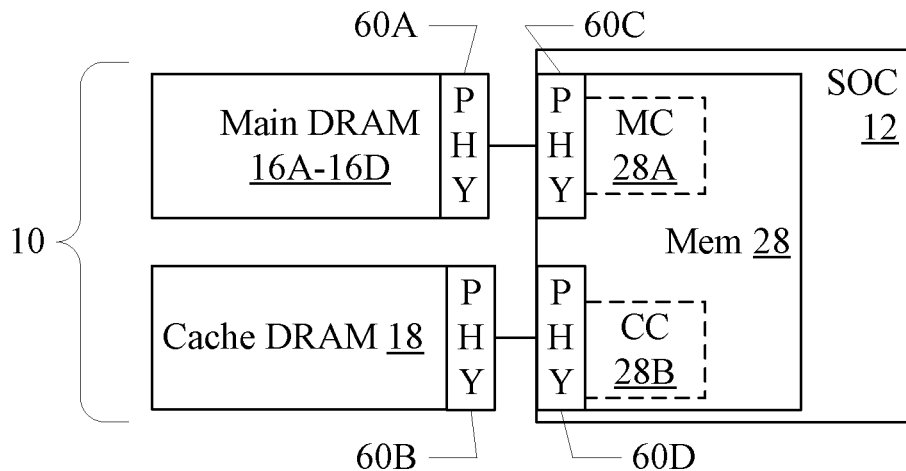
FIG. 1 is a block diagram of one embodiment of a system on a chip (SOC) with a memory controller and physical layer circuits to the main memory and cache memory.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

DETAILED DESCRIPTION OF EMBODIMENTS

Turning now to FIG. 1, a block diagram is shown of one embodiment of a system including a memory system 10 and an integrated circuit 12. In the illustrated embodiment, the integrated circuit 12 is a system on a chip (SOC), and the SOC will be used as an example in other embodiments in this disclosure. However, any integrated circuit may be used in the various embodiments. In the embodiment of FIG. 1, the memory 10 includes multiple main dynamic random access memory chips (DRAM) 16A-16D and a cache DRAM 18. The main DRAM 16A-16D includes a physical layer circuit (PHY) 60A and the cache DRAM 18 includes a PHY 60B. The PHY 60A is coupled to a PHY 60C in the SOC 12, and the PHY 60B is coupled to a PHY 60D in the SOC 12. More particularly, the PHY 60C may be coupled to a main memory controller (MC) block 28A and the PHY 60D may be coupled to a cache controller block (CC) 28B, both of which may be part of a memory controller 28 (Mem) in FIG. 1.

The memory system 10 may include two different types of DRAM, which the memory controller 28 in the SOC 12 may control independently: main DRAMs 16A-16D and cache DRAM 18. The combination of the main DRAMs 16A-16D and the cache DRAM 18 may provide high bandwidth for the memory agents in the SOC 12 while also providing high storage capacity overall and low power. Storage capacity may be provided by the main DRAMs 16A-16D, which may have memory designed for density and capacity. The high bandwidth may be provided by wide interfaces between the cache DRAM 18 and the SOC 12. The wider interfaces may be clocked at slower clock rates, saving power compared to the high speed, narrow interfaces of traditional synchronous DRAM. In an embodiment, the interface between the cache DRAM 18 and the SOC 12 and the interface between the main DRAMs 16A-16D and the SOC 12 may be different widths (e.g. the cache DRAM 18 may have an interface that is more than 2 times wider than the main DRAMs 16A-16D, and in some embodiments may be 2 to 4 times wider). Additionally, the cache DRAM 18 may include a relatively small memory array that may allow for lower density, but higher bandwidth implementation at lower energy. For example, the memory array may have more banks, smaller page size, lower latency, more channels, etc. as compared to traditional DRAM or the DRAMs 16A-16D. In some embodiments, the memory array may include one or more of the following to reduce power, as compared to similar properties of the DRAMs 16A-16D: fewer memory cells per bit line, fewer memory cells per word line, and/or smaller banks. More particularly, in an embodiment, the memory array in the cache DRAM 18 may trade off lower density than the main DRAMs 16A-16D for lower energy consumption. The lower density may be realized in the cache DRAM 18 due to one or more of the following (as compared to the main DRAMs 16A-16D): fewer memory cells per bit line, fewer memory cells per word line, larger number of banks, and/or smaller banks. In an embodiment, the cache DRAM 18 may have a memory array that is 4×-16× less dense than the memory array of the main DRAMs 16A-16D, and preferably 6×-8× less dense. The data path design within the banks and from the banks to the PHY 60B may be optimized. Additionally, the data path from the cache DRAM 18 to the SOC 12 may be a point to point, low capacitance, low voltage connection.

With two types of DRAM forming the memory system, one of which may be optimized for bandwidth and the other of which may be optimized for capacity, the goals of bandwidth increase and capacity increase may both be realized, in some embodiments. Additionally, energy efficiency may be managed in the high bandwidth portion of the memory (which is lower capacity/smaller, and thus density can be lower). The portion of the memory that is optimized for capacity may have a lower bandwidth goal and a relaxed (longer) latency goal, since these goals may be served by the portion that is optimized for bandwidth. Similarly, the portion of the memory that is optimized for bandwidth may have lower area efficiency goals, but latency and energy efficiency improvements may be made. Overall, a high bandwidth, low latency, energy efficient, and high capacity memory system may be realized at low cost, in some embodiments. Particularly, implementing the high density portion (main DRAMs 16A-16D) and the high bandwidth, low latency portion (cache DRAM 18) in separate chips that together form the main memory system 10 may allow for each memory 16A-16D and 18 to implement energy efficiency improvements, which may provide a highly energy efficient memory solution that is also high performance and high bandwidth. Specific optimizations that may be made in each memory in various embodiments are detailed further below with regard to FIGS. 12 to 14.

In an embodiment, the cache DRAM 18 may implement a simplified command set in order to reduce the number of commands transmitted to the cache DRAM 18 per access. For example, the main DRAMs 16A-16D may include an activate command and a column address strobe (CAS) command for each read or write access, and optionally a precharge command. On the other hand, the cache DRAM 18 may support a read command for a read access and a write command for a write access. Internal to the cache DRAM 18, the read or write command may cause multiple internal operations such as an activate, one or more CAS read or write (respectively), and a precharge. Since fewer commands are transmitted over the interface for a given access, the energy consumed for the access may be reduced.

As illustrated, the memory controller 28 controls the main DRAM 16A-16D and the cache DRAM 18 independently. Particularly, in one embodiment, the main memory controller block 28A and the cache controller block 28B are shown. The main memory controller block 28A may control the main DRAM 16A-16D and the cache controller block 28B may control the cache DRAM 18. The caching of data from the main DRAM 16A-16D in the cache DRAM 18 is under the control of the memory controller 28, and may be performed by moving data from the main DRAM 16A-16D through the SOC 12 to the cache DRAM 18. That is, the caching policies, allocation and deallocation of cache lines, etc. may be determined by the memory controller 28. By storing frequently-accessed data in the high bandwidth, low power cache DRAM 18, effective memory bandwidth may be higher than that of the main DRAM 16A-16D, while the high capacity of the main DRAM 16A-16D may be enjoyed as well. Additional circuitry in the memory controller 28 besides the main memory controller block 28A and the cache controller block 28B may coordinate the caching policies, transfer of data, etc., or the blocks 28A-28B may interact directly to perform the caching operation.

Figure 2:
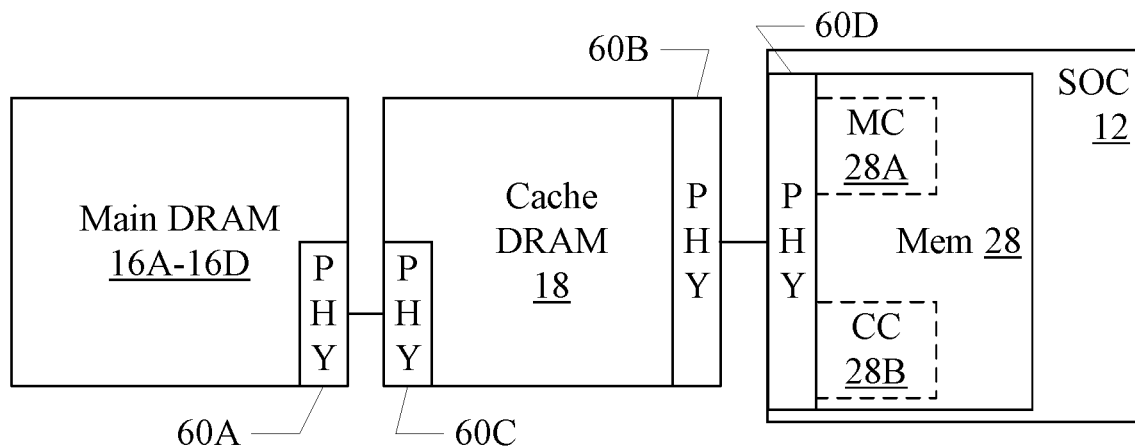
FIG. 2 is a block diagram of another embodiment of the SOC with a memory controller and a physical layer circuit to the cache memory with another physical layer circuit from the cache memory to the main memory.

FIG. 2 is a block diagram of another embodiment of the main DRAM 16A-16D and the cache DRAM 18 coupling to the SOC 12. In the embodiment of FIG. 2, a single PHY 60D may be implemented in the SOC 12, coupled to a single PHY 60B in the cache DRAM 18. There may be logic that may decode the operations that are bound for the main DRAM 16A-16D and the decoded operations may be transported to the DRAM 16A-16D through the PHYs 60C and 60A as shown in FIG. 2.

Figure 3:
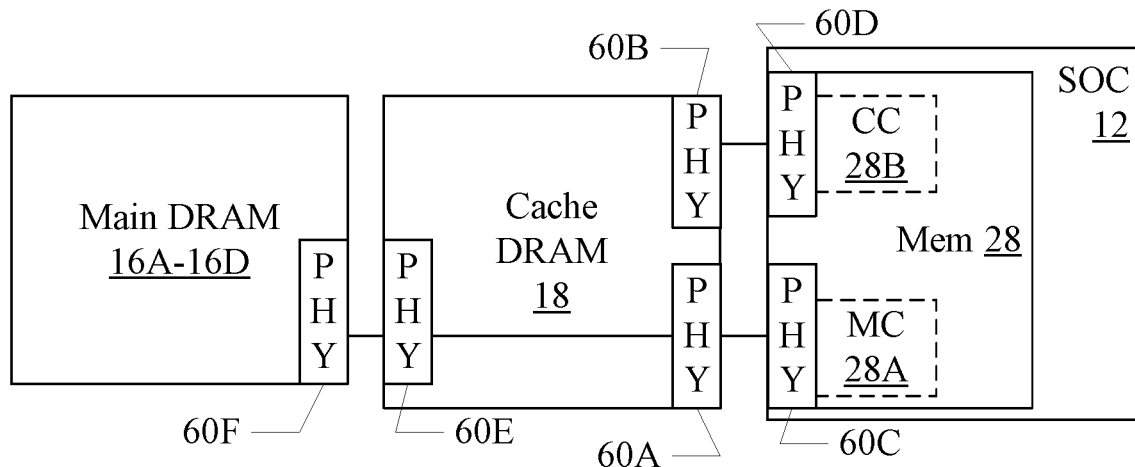
FIG. 3 is a block diagram of another embodiment of the SOC with a memory controller and physical layer circuits to the cache memory and main memory and another physical layer circuit with another physical layer circuit from the cache memory to the main memory.
Figure 4:
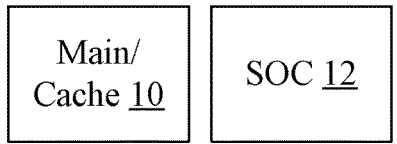
FIG. 4 is a block diagram illustrating a system on a chip (SOC) and a memory for an embodiment.

FIG. 3 is a block diagram of a third embodiment of the main DRAM 16A-16D and the cache DRAM 18 coupling to the SOC 12. In the embodiment of FIG. 3, a separate PHYs 60D and 60C may be implemented for the cache controller block 28B to communicate with the cache DRAM 18 (PHY 60B) and for the memory controller block main to communicate with the main DRAM 16A-16B (PHY 60A), respectively. However, the cache DRAM 18 may serve as a host for the transport layer to the main DRAM 16A-16D, communicating with a PHY 60F in the main DRAM 16A-16D via a PHY 60E as shown in FIG. 3.

As FIGS. 1-3 illustrate, in some embodiments, the PHY protocol for the cache DRAM 18 may be different from the PHY protocol of the main DRAM 16A-16D, and both protocols may be supported in the various configurations. In other embodiments, the same PHY protocol may be used.

Figure 5:
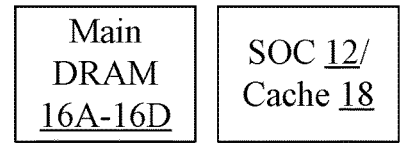
FIG. 5 is a block diagram illustrating an SOC, including one or more caches, and a main memory coupled to the SOC/cache for an embodiment.
Figure 6:
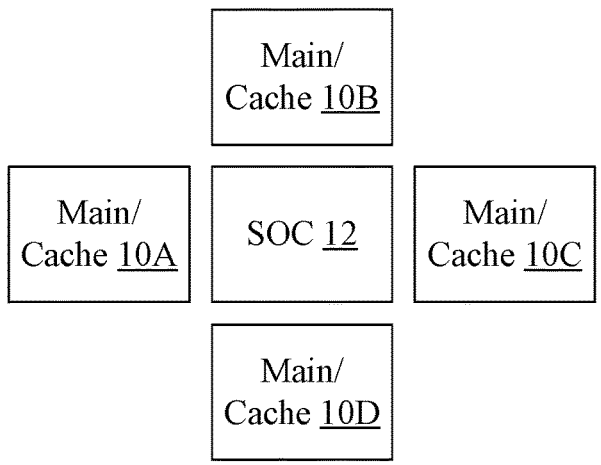
FIG. 6 is a block diagram illustrating the SOC and multiple memories for an embodiment.
Figure 7:
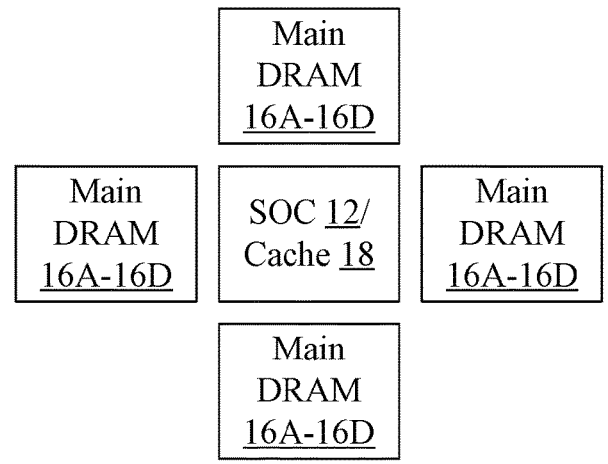
FIG. 7 is a block diagram illustrating the SOC, including one or more cache, and multiple main memories for an embodiment.

FIGS. 4 through 7 illustrate the scalability of the memory system 10 for different applications, based on various embodiments of packaging the cache DRAM 18 and the main DRAM 16A-16D with the SOC 12. For example, in FIGS. 4 and 6, the main DRAM 16A-16D and the cache DRAM 18 (i.e. the main memory 10) are packaged separately from the SOC 12. For small form factor devices, such as mobile phones or the like, a system such as FIG. 4 may be used, with a memory system 10 to one side of the SOC 12. On the other hand, for a larger form factor device, such as a tablet computer, laptop, or desktop computer, an embodiment such as FIG. 6 may be used, with the memory system 10 formed from multiple portions on different sides of the SOC 12 (e.g. portions 10A, 10B, 10C, and 10D in FIG. 6). Any number of portions may be used in various embodiments. FIGS. 5 and 7 illustrate an embodiment in which the SOC 12 and the cache DRAM 18 are packaged together, and interface to the main DRAMs 16A-16D. FIG. 5 is similar to FIG. 4 and illustrates the main DRAMs 16A-16D to one side of the SOC 12/cache DRAM 18 for, e.g., small form factor devices, such as mobile phones or the like. On the other hand, for a larger form factor device, an embodiment such as FIG. 7 may be used. In FIG. 7, multiple instances of the main DRAMs 16A-16D are shown on different sides of the SOC 12 and cache DRAM 18. The cache DRAM 18 in the package with the SOC 12 may also be scalable for different implementations, as desired. See, e.g., FIGS. 8 and 9 below. Any number of instances may be used in various embodiments. As mentioned previously, each main DRAM 16A-16D shown in FIGS. 4-7 may be one DRAM or multiple DRAMs, as desired in various embodiments.

Figure 8:
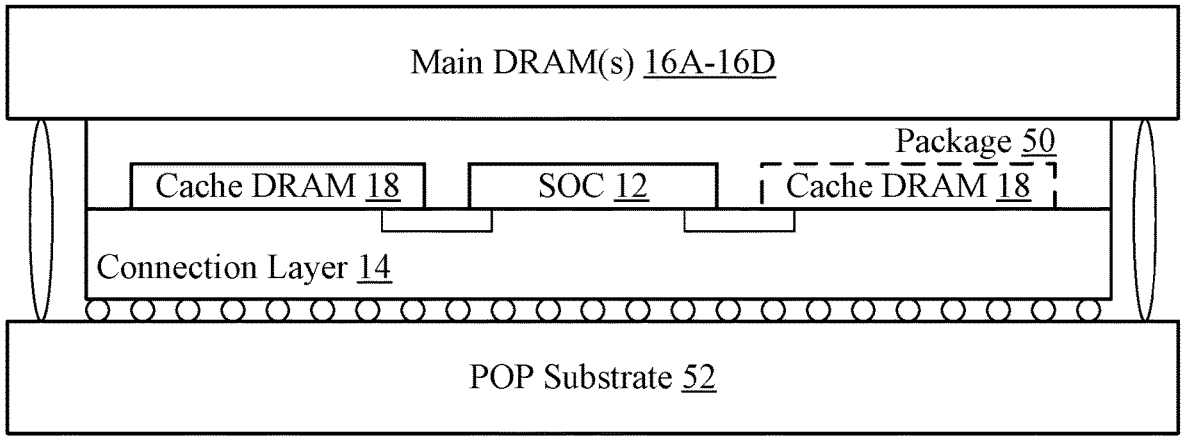
FIG. 8 is a block diagram of an embodiment of a system having main memory and cache memory in a package-on-package (POP) configuration.
Figure 9:
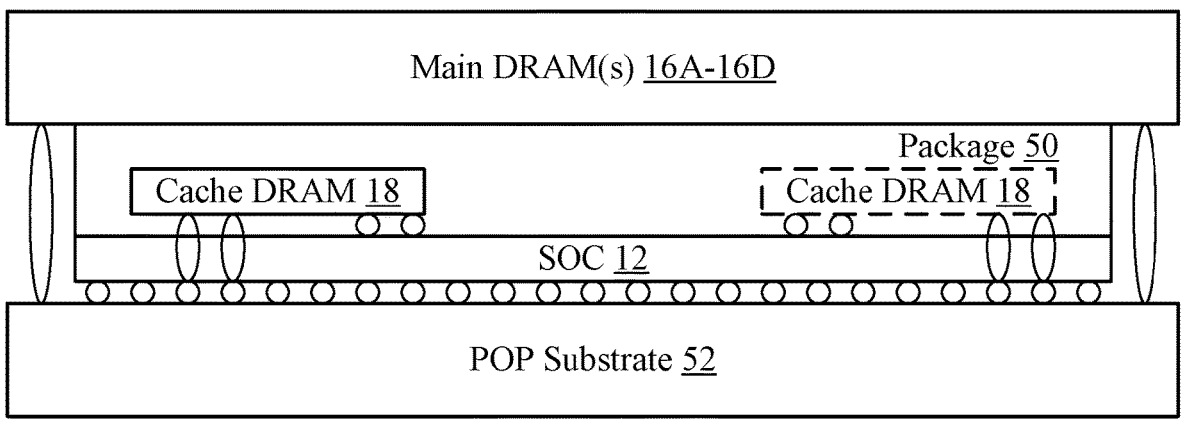
FIG. 9 is a block diagram of another embodiment of a system having main memory and cache memory in a package-on-package (POP) configuration.

FIG. 8 is a block diagram of one embodiment of a system illustrating a package 50 that includes the SOC 12 and the cache DRAM 18. Optionally, multiple instances of the cache DRAM 18 may be included in some embodiments (e.g. a second cache DRAM 18 is shown in dotted form in FIG. 8). A connection layer 14 may be included in the package, including relatively short interconnect to the cache DRAM(s) 18 (e.g. see FIG. 12 and the discussion below for more details). One or more main DRAMs 16A-16D may be assembled with the SOC 12/cache DRAM 18 in a package on package (POP) configuration using the POP substrate 52 to connect between the main DRAMs 16A-16D and the connection layer 14 (and further to the SOC 12, wiring in the connection layer 14 and POP substrate 52 not shown in FIG. 8). FIG. 9 is another example of POP packaging with one or more main DRAMs 16A-16D and the SOC 12/cache DRAM 18. In the embodiment of FIG. 9, the cache DRAM 18 (or multiple cache DRAMs 18, in some embodiments) are mounted on the SOC 12 using any desired techniques. For example, chip on wafer (COW) packaging may be used; wafer on wafer (WOW) packaging may be used, chip on chip (COC) packaging may be used; etc.

Figure 10:
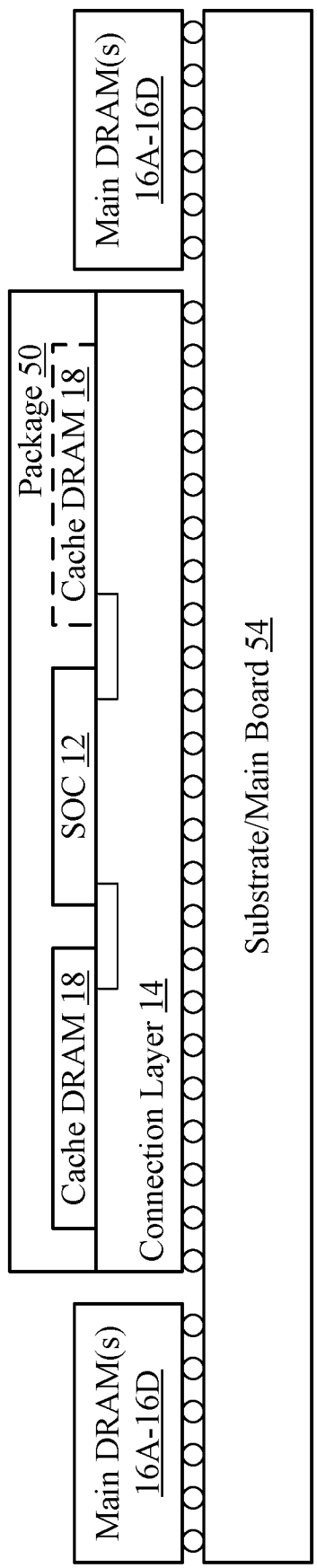
FIG. 10 is a block diagram of one embodiment of a system having main memory and cache memory wherein the main memory is packaged discretely.
Figure 11:
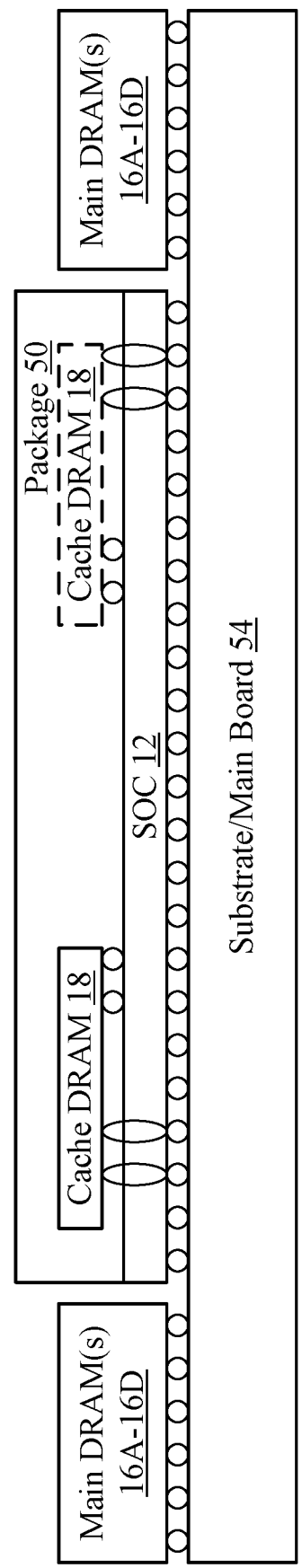
FIG. 11 is a block diagram of another embodiment of a system having main memory and cache memory wherein the main memory is packaged discretely.

In other embodiments, the main DRAM 16A-16D may be packaged separate from the SOC 12 and the cache DRAM 18. For example, FIGS. 10 and 11 illustrate the SOC 12/cache DRAM 18 as illustrated in FIGS. 8 and 9, respectively, but with the separately packaged main DRAMs 16A-16D coupled to a substrate or main board 54 for a system. In some implementations, the embodiments of FIGS. 10 and 11 may be multi-chip modules (MCMs), and the substrate 54 may be an MCM substrate. In other embodiments, the main board 54 may be various types of circuit boards, e.g. printed circuit boards (PCBs). While two sets of main DRAMs 16A-16D are shown, each DRAM may be one or more DRAMs and there may be one DRAM/DRAM set or multiple DRAM sets as shown in FIGS. 6 and 7.

Figure 12:
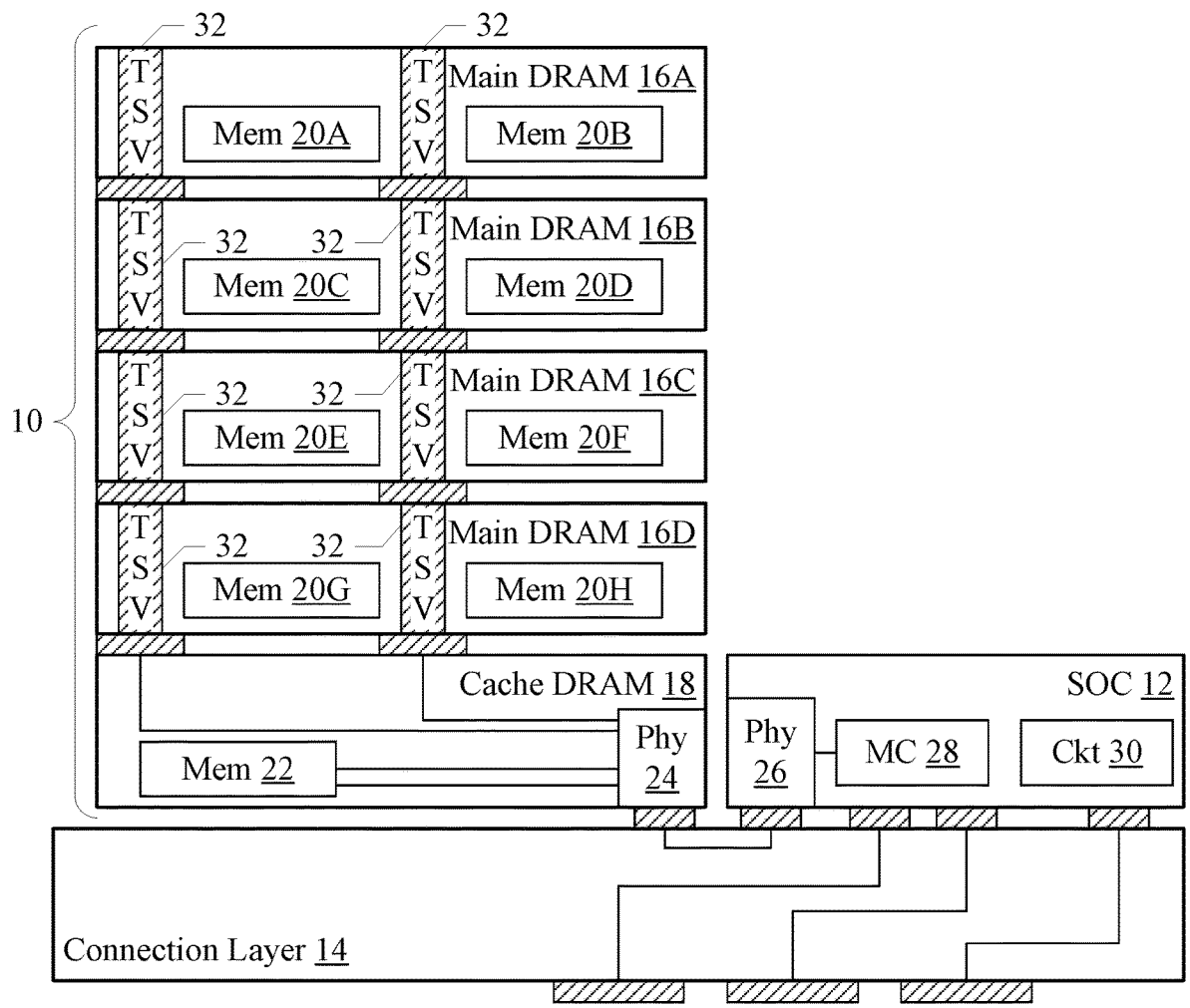
FIG. 12 is a block diagram of one embodiment of a system including cache and main memory dynamic random access memory (DRAM).
Figure 13:
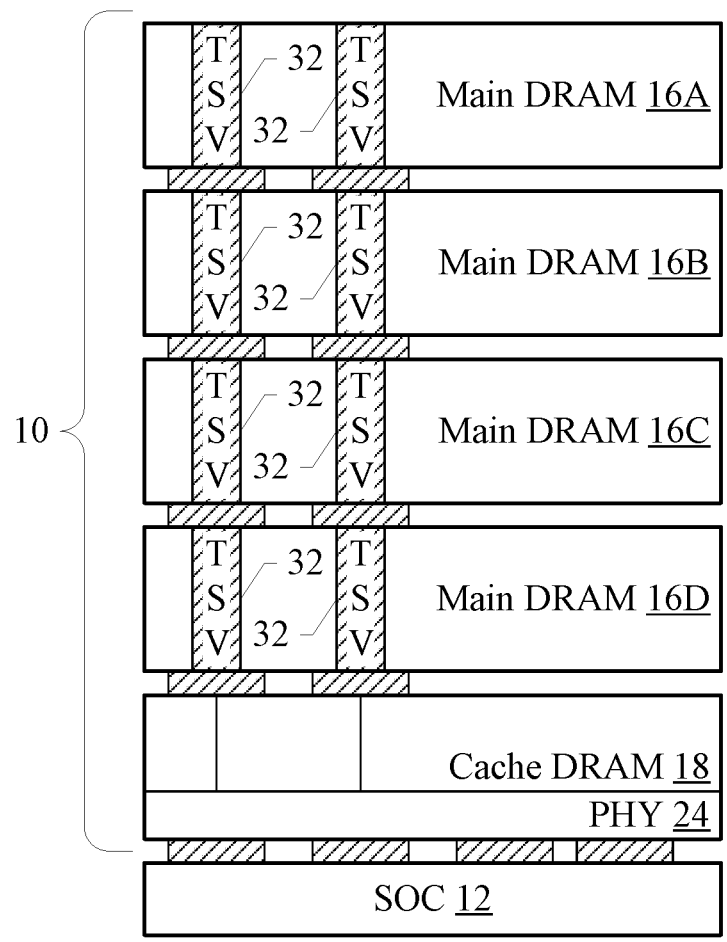
FIG. 13 is a block diagram of another embodiment of the system.
Figure 14:
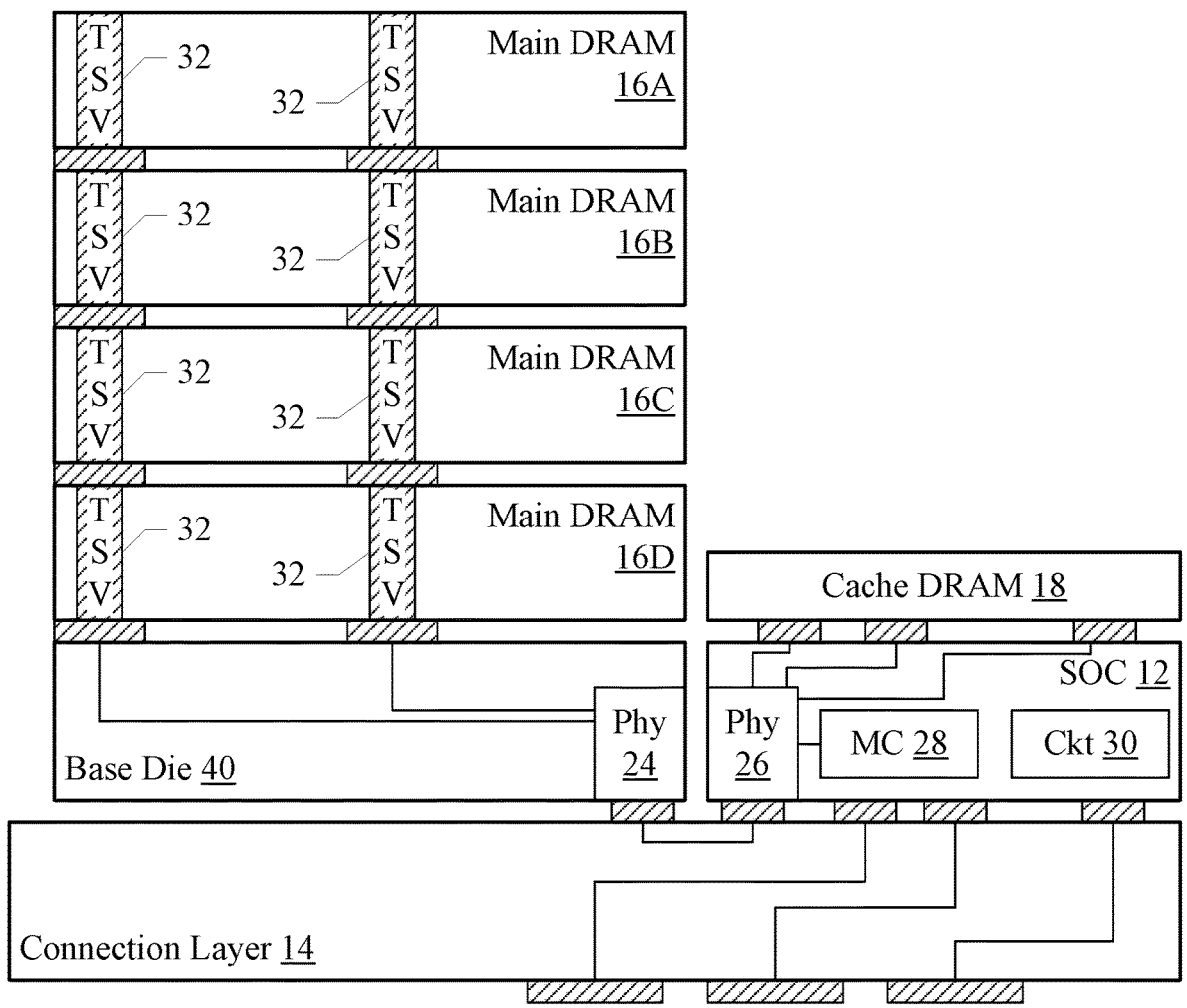
FIG. 14 is a block diagram of yet another embodiment of the system.

FIGS. 12 to 14 illustrate various exemplary 2.5 dimensional (D) and 3D configurations of the SOC 12, the cache DRAM 18, and the main DRAM 16A-16D. It is noted, however, that any packaging solution, including various other 2.5D and/or 3D solutions, may be used in other embodiments.

Turning now to FIG. 12, a block diagram is shown of one embodiment of a system including the memory system 10 and the SOC 12 coupled through a connection layer 14. In the embodiment of FIG. 12, the memory 10 includes multiple main dynamic random access memory chips (DRAM) 16A-16D and a cache DRAM 18. Each main DRAM 16A-16B includes one or more memory arrays 20A-20H, as shown in FIG. 12. The cache DRAM 18 includes a memory array 22 and physical layer interface circuit (PHY circuit 24). The PHY circuit 24 is coupled through pins of the cache DRAM 18 to the connection layer 14, and through the connection layer 14 to pins of the SOC 12 and then to a corresponding PHY circuit 26 in the SOC 12. The PHY 26 is coupled to a memory controller 28 in the SOC 12, which further includes various other circuits 30 (e.g. processors, peripherals, etc.). The other circuits 30 may be coupled through other pins of the SOC 12 to the opposite side of the connection layer 14 for coupling to other components in a system.

As mentioned above, the memory system 10 may include two different types of DRAM, which the memory controller 28 in the SOC 12 may control independently: main DRAMs 16A-16D and cache DRAM 18. It is noted that, while one PHY circuit 24 and one PHY circuit 26 are shown in the embodiment of FIG. 12, other embodiments may have independent PHY circuits 24 and 26 for the cache DRAM 18 and for the main DRAMs 16A-16D, as discussed above with regard to PHY circuits 60A-60D (and 60E and 60F, in the embodiment of FIG. 3).

As mentioned above, the memory arrays 20A-20H may be designed for density, to provide high storage capacity per unit area of the DRAMs 16A-16D. The DRAMs 16A-16D may implement large page sizes, for example, as compared to the cache DRAM 18. Fewer banks may be included in the DRAMS 16A-16D, as compared to the cache DRAM 18. To further increase density, some control logic to the DRAMs 16A-16D, such as test circuitry, redundancy control, error correction code (ECC) mechanisms, reference voltage logic, temperature control reference logic, etc. may be located on the cache DRAM 18.

The smaller page sizes of the cache DRAM 18 (and the larger number of open pages, due to the larger number of banks in the cache DRAM 18) may be conducive to frequent small accesses (compared to the page size) by many memory agents in the SOC 12. For example, processors tend to read one or a small number of cache lines of data, where a traditional page size in the DRAM may be 2 to 4 kilobytes in size. Each time a page is opened, the page full of data may be read from the memory arrays and captured in sense amplifiers and/or registers for access. When the page is closed and a new page is opened, the full new page of data is read. On the other hand, reading a smaller page consumes proportionally less power. When numerous agents are competing for access to memory, the page conflicts and page openings/closings may be more frequent and the reduced power consumption per page may result in lower power consumption overall.

Thus, the memory controller 28 may be configured to write data read from the main DRAMs 16A-16D to the cache DRAM 18 if the data is likely to be reused. Various caching strategies may be used. However, because the cache DRAM 18 is denser than on-SOC static RAM (SRAM) would be, a larger cache may be implemented than may be possible with SRAM. Furthermore, DRAM includes fewer transistors per bit of data stored than SRAM (e.g. one transistor per bit versus six transistors per bit), and thus DRAM has lower leakage power than SRAM on a per bit basis. Additionally, the savings in silicon die area on the SOC 12 by eliminating an on-chip memory cache may offset the expense of the cache DRAM 18 to some extent, in some embodiments.

The main DRAMs 16A-16D may employ through-silicon-via (TSV) interconnect to reduce interconnect length and capacitance (e.g. TSVs 32 shown in FIG. 12). The TSVs 32 may be formed using known TSV manufacturing techniques, for example. The TSVs 32 may be connected together when the DRAMs 16A-16D are stacked through pins between the memories. The DRAM 16D (the main DRAM at the bottom of the stack) may be connected through pins to the cache DRAM 18, which may route the signals to the PHY circuit 24. The PHY circuit 24 may have outputs to the PHY circuit 26 and/or inputs from the PHY circuit 26 that are physically located along an edge of the cache DRAM 18, and the inputs/outputs of the PHY circuit 26 may similarly be physically located along an edge of the SOC 12. Thus, short wiring paths through the connection layer 14 may be used to connect the PHY circuits 24/26. The PHY circuit 24 and the PHY circuit 26 may be designed to communicate through the connection layer 14 over relatively short interconnect to a fixed, small load. Small, low power drivers may be used as compared to a traditional DRAM interface, which would have longer interconnect and may have multiple DRAM loads.

Additionally, because the cache DRAM 18 routes the TSV interconnects to the desired position at the edge of the cache DRAM 18, the TSVs may be more freely placed in the main DRAMs 16A-16D. Congestion may be relieved and more interconnect may be provided than would be possible in traditional DRAMs, in some embodiments.

While TSVs are used in the illustrated embodiments, other embodiments may use silicon interposer interconnect or fanout technologies such as integrated fanout (InFO) available from Taiwan Semiconductor Manufacturing Company™ (TSMC). The pins mentioned herein may be any type of inter-chip interconnect. For example, the pins may be "microbumps," or may be solder balls or other pin forming materials. Other embodiments show the solder balls explicitly, but other pin constructions may be used in those embodiments as well.

The connection layer 14 may be any form of chip to chip interconnection. For example, the connection layer 14 may be a silicon interposer, redistribution layer, ceramic, organic, or printed-circuit-board-like substrate, etc.

FIG. 13 is a block diagram of another embodiment of the memory system 10 on the SOC 12. In the embodiment of FIG. 2, the pins that connect the PHY circuit 24 to the PHY circuit 26 need not be on one edge since the packages are directly connected rather than coupled through the connection layer 14. Pins on the bottom side of the SOC 12 (not shown) may be used to couple the SOC into the rest of a system. As mentioned above, other embodiments may have independent PHY circuits 24 for the cache DRAM 18 and for the main DRAMs 16A-16D.

FIG. 14 is a block diagram of a third embodiment of the memory system in which the cache DRAM 18 is implemented in a stack with the SOC 12 and the main DRAM 16A-16D is coupled to the SOC 12 through the connection layer 14. In this embodiment, the main DRAM 16A-16D is stacked on a base die 40 that routes the signals from the TSVs 32 to the PHY circuit 24, and through short (near the edge) interconnect to the PHY 26 in the SOC 12.

The DRAM 18 and the SOC 12 may be connected using a variety of packaging technologies. Either the DRAM 18 or the SOC 12 may be the "top" chip (where "top" is in reference to the orientation of FIG. 14). Any 3-D chip packaging technology may be used. For example, one or more of the following may be used in various embodiments: TSV connection, COW packaging, WOW packaging, POP packaging, etc.

Numerous variations and modifications will become apparent to those skilled in the art once the above disclosure is fully appreciated. It is intended that the following claims be interpreted to embrace all such variations and modifications.

What is claimed is:

1. A system comprising:
   a memory including a first type of dynamic random access memory (DRAM) on at least one first integrated circuit and a second type of DRAM on at least one second integrated circuit, wherein the first type of DRAM and the second type of DRAM differ in at least one characteristic, and wherein the second integrated circuit includes a first physical layer circuit;
   a third integrated circuit coupled to the memory, wherein the third integrated circuit includes a memory controller and a second physical layer circuit; and
   wherein the first physical layer circuit is coupled to the second physical layer circuit and is configured to communicate with the second physical layer circuit on behalf of both the first integrated circuit and the second integrated circuit, and wherein the memory controller comprises a first control block configured to control the first type of DRAM over the second physical layer circuit and a second control block configured to control the second type of DRAM over the second physical layer circuit, wherein the first control block and the second control block independently control the first type of DRAM and the second type of DRAM, respectively, even though the first control block and the second control block communicate with the memory by sharing the second physical layer circuit.

2. The system as recited in claim 1 wherein the at least one first integrated circuit is a plurality of integrated circuits in a stack, wherein the plurality of integrated circuits are coupled to the first physical layer circuit.

3. The system as recited in claim 2 wherein the plurality of integrated circuits include through silicon vias forming a portion of an interconnect to the first physical layer circuit.

4. The system as recited in claim 1 wherein the memory controller is configured to operate the second type of DRAM as a cache for the first type of DRAM.

5. The system as recited in claim 1 wherein the second type of DRAM has higher bandwidth that the first type of DRAM.

6. The system as recited in claim 1 wherein the second type of DRAM has lower latency than the first type of DRAM.

7. The system as recited in claim 1 wherein the first type of DRAM is higher density than the second type of DRAM.

8. The system as recited in claim 1 where the second type of DRAM includes fewer memory cells per bit line than the first type of DRAM.

9. The system as recited in claim 1 wherein the second type of DRAM includes fewer memory cells per word line than the first type of DRAM.

10. The system as recited in claim 1 wherein the second type of DRAM includes smaller banks than the first type of DRAM.

11. The system as recited in claim 1 wherein the second type of DRAM includes more banks than the first type of DRAM.

12. The system as recited in claim 1 wherein the second type of DRAM is 4×-16× less dense than the first type of DRAM.

13. The system as recited in claim 12 wherein the second type of DRAM is 6×-8× less dense than the first type of DRAM.

14. The system as recited in claim 1 wherein a given access to the first type of DRAM includes a plurality of commands over a first interface to the first integrated circuit, and wherein the given access to the second type of DRAM includes a single command over a second interface to the second integrated circuit.

15. A memory comprising:
   one or more first integrated circuits including a first dynamic random access memory (DRAM) of a first type; and
   a second integrated circuit coupled to the one or more first integrated circuits in a stack, wherein the second integrated circuit includes a second DRAM of a second type and further includes a physical layer circuit configured to communicate on behalf of the first DRAM and the second DRAM, and wherein the first DRAM and the second DRAM are controlled independently through the physical layer circuit by a first control block and a second control block in a memory controller even though the first control block and the second control block communicate with the first DRAM and the second DRAM by sharing the physical layer circuit.

16. The memory as recited in claim 15 wherein the second type of DRAM has higher bandwidth that the first type of DRAM.

17. The memory as recited in claim 15 wherein the second type of DRAM has lower latency than the first type of DRAM.

18. The memory as recited in claim 15 wherein the first type of DRAM is higher density than the second type of DRAM.

19. A method comprising:
    communicating on behalf of a first dynamic random access memory (DRAM) and a second DRAM by a physical layer circuit in a memory that comprises one or more first integrated circuits including the first DRAM of a first type and a second integrated circuit coupled to the one or more first integrated circuits in a stack, wherein the second integrated circuit includes the second DRAM of a second type and further includes the physical layer circuit; and
    independently controlling the first DRAM and the second DRAM through the physical layer circuit by a first control block and a second control block in a memory controller during the communicating even though the first control block and the second control block share the physical layer circuit.

20. The method as recited in claim 19 further comprising operating the second type of DRAM as a cache for the first type of DRAM.

\* \* \* \* \*